United States Patent [19]

Ida

[11] Patent Number: 5,067,032
[45] Date of Patent: Nov. 19, 1991

[54] HEAD DRIVER

[75] Inventor: Shizuo Ida, Itami, Japan

[73] Assignee: Mitsubishi Denki Kabushiki Kaisha, Tokyo, Japan

[21] Appl. No.: 352,877

[22] Filed: May 17, 1989

[30] Foreign Application Priority Data

Dec. 9, 1988 [JP] Japan .................. 63-312675

[51] Int. Cl.$^5$ .................. G11B 5/09; G11B 5/02
[52] U.S. Cl. .................. 360/46; 360/68
[58] Field of Search .................. 360/61, 62, 46, 67, 360/68

[56] References Cited

U.S. PATENT DOCUMENTS

| | | | |
|---|---|---|---|
| 4,518,925 | 5/1985 | Fukasawa | 360/67 |
| 4,639,794 | 1/1987 | Ferrier | 360/46 |
| 4,647,988 | 3/1987 | Takehara | 360/46 |
| 4,821,127 | 4/1989 | Soga et al. | 360/66 |

*Primary Examiner*—Aristotelis Psitos
*Assistant Examiner*—Won Tae C. Kim
*Attorney, Agent, or Firm*—Oblon, Spivak, McClelland, Maier & Neustadt

[57] ABSTRACT

A charging/discharging circuit charges a capacitor in response to a first level of a control signal, while discharging the capacitor in response to a second level. A voltage-current conversion circuit converts charging voltage of the capacitor into current which is responsive to the level of the charging voltage. A current supply circuit supplies output current from the voltage-current conversion circuit to a coil head. Thus, no abrupt change is caused in current flowing through the coil head in switching of the control signal.

15 Claims, 4 Drawing Sheets

5,067,032

HEAD DRIVER

BACKGROUND OF THE INVENTION

1. Field of the Invention

The present invention relates to a head driver, and more particularly, it relates to a head driver for driving a control head of a video tape recorder for recording a control signal such as a program search signal, a signal for controlling a tape travelling speed or the like in a control track of a video tape, for example.

2. Description of the Background Art

FIG. 1 is a circuit diagram showing a conventional control head driver of a video tape recorder. A signal received in an input terminal 1 is directly supplied to a base of an NPN transistor Q1 and a current mirror 3. The signal received in the input terminal 1 is also supplied to a base of an NPN transistor Q2 and a current mirror 4 through an inverter 2. The transistors Q1 and Q2 have collectors which are connected to source voltage $V_{CC}$. A control head coil 5 for recording a control signal in a video tape is connected between emitters of the transistors Q1 and Q2.

The current mirror 3 is formed by an NPN transistor Q3 and a diode D1. The transistor Q3 has a collector which is connected to the emitter of the transistor Q2, an emitter which is grounded, and a base which is connected to the input terminal 1 as well as to an anode of the diode D1. The transistors Q2 and Q3 form a totem pole type driver. The diode D1 has a cathode grounded.

The current mirror 4 is formed by an NPN transistor Q4 and a diode D2. The transistor Q4 has a base which is connected to an output of an inverter 2 as well as to an anode of the diode D2, a collector which is connected to the emitter of the transistor Q1 and an emitter which is grounded. The transistors Q1 and Q4 form a totem pole type driver. The diode D2 has a cathode grounded.

The current mirrors 3 and 4 enter operable states (hereinafter referred to as selected states) upon supply of a high-level signal, and start operation when current is supplied from a current mirror 6. Upon supply of a low-level signal, on the other hand, the current mirrors 3 and 4 are disabled not to operate even if current is supplied from the current mirror 6.

The current mirror 6, which is adapted to supply current to the current mirrors 3 and 4, is formed by PNP transistors Q5 to Q8. The transistors Q5 to Q7 have bases which are connected with each other, and emitters which are connected to the source voltage $V_{CC}$. The transistor Q5 has a collector which is connected to the base of the transistor Q3. The transistor Q6 has a collector which is connected to the base of the transistor Q4. The transistor Q8 has a base and an emitter which are connected to the collector and the base of the transistor Q7 respectively, and a collector grounded.

The NPN transistor Q9 has a collector which is connected to the collector of the transistor Q7 through a resistor R1, a base which is connected to a control signal input terminal 7, and an emitter grounded. In response to a control signal from the control signal input terminal 7, the transistor Q9 activates or disables the current mirror 6.

FIG. 2 shows voltage waveforms at the respective terminals of the circuit shown in FIG. 1. The operation of the circuit shown in FIG. 1 will now be described with reference to FIG. 2. It is assumed here that an input signal A received in the input terminal 1 and a control signal B received in the control signal input terminal 7 are both at a low level. In this case, the transistor Q2 is in an ON state and the transistor Q1 is in an OFF state, while the current mirror 4 is in a selected state and the current mirror 3 is disabled. Since the control signal B is at a low level, the transistor Q9 is turned off, the current mirror 6 is in a disabled state, and the current mirror 4 performs no operation. Thus, no current flows through the control head coil 5, whereby potentials at both ends C and D of the control head coil 5 are substantially at the source voltage $V_{CC}$.

It is assumed that only the input signal A is changed from a low level into a high level at a time t1. Then, the transistor Q2 is turned off and the transistor Q1 is turned on, while the current mirror 3 enters a selected state and the current mirror 4 is disabled. The control signal B remains at a low level. Thus, no current flows through the control head coil 5 similarly to the above case, whereby the potentials at the ends C and D of the control head coil 5 are substantially at the source voltage $V_{CC}$.

It is assumed that the control signal B is changed from a low level into a high level at a time t2. The input signal A remains at a high level a the time t2. Then, the transistor Q9 is turned on and current is supplied to the current mirror 6 through the resistor R1. The current mirror 3 starts operation to flow current in a direction from the end D to the end C of the control head coil 5. At this time, however, back electromotive force is caused by abrupt current change, so that no current instantaneously flows through the control head coil 5. In an instant of the operation of the current mirror 3, therefore, the potential at the point C is pulled down to GND. After the current flowing through the control head coil 5 becomes sufficient, the potential at the point C is stabilized at a level which is smaller than the source voltage $V_{CC}$ by voltage drops caused by the transistor Q1 and the control head coil 5. On the other hand, the potential at the point D is stabilized at a level which is smaller than the source voltage $V_{CC}$ by a voltage drop caused by the transistor Q1. In this mode, the control track of the video tape is magnetized by the current flowing in the direction from the end D to the end C, to record a control signal of prescribed polarity.

It is assumed that only the control signal B is changed from a high level into a low level at a time t3. Then, the transistor Q9 is turned off, the current mirror 6 is disabled and no current is supplied to the current mirror 3. Therefore, the current flowing through the control head coil 5 in the direction from the end D to the end C is cut off to cause abrupt current change. In the instant when the control signal B is changed from a high level into a low level, therefore, back electromotive force is caused to continuously make the current flow in the direction from the end D to the end C, whereby the potential at the point C exceeds the source voltage $V_{CC}$. After a lapse of a constant period, no current flows through the control head coil 5 and the potentials at the points C and D substantially reach the source voltage $V_{CC}$.

It is assumed that the input signal A is changed from a high level into a low level at a time t4. Then, the transistor Q2 is turned on and the transistor Q1 is turned off, while the current mirror 3 is disabled and the current mirror 4 enters a selected state. Since the control signal B is at a low level, no current is supplied to the current mirrors 3 and 4 at this time, and hence no current flows through the control head coil 5. The ends C and D of the control head coil 5 are at the same potentials.

It is assumed that only the control signal B is changed into a high level at a time t5. Then, the transistor Q9 is turned on and the current mirror 6 is activated, while the current mirror 4 starts operation to flow current in a direction form the end C to the end D of the control head coil 5. At this time, back electromotive force is caused by abrupt current change, so that almost no current instantaneously flows through the control head coil 5. In an instant of the operation of the current mirror 4, therefore, the potential at the point D is pulled down to GND. After the current flowing in the direction from the end C to the end D of the control head coil 5 becomes sufficient, the potential at the point D is stabilized at a level which is smaller than the source voltage $V_{CC}$ by voltage drops caused by the transistor Q2 and the control head coil 5. On the other hand, the potential at the point C is stabilized at a level which is smaller than the source voltage $V_{CC}$ by a voltage drop caused by the transistor Q2. In this mode, a control signal which is reverse in polarity to the above is recorded in the video tape.

It is assumed that only the control signal B is changed from a high level into a low level at a time t6. Then, the transistor Q9 is turned off, the current mirror 6 is disabled, and no current is supplied to the current mirror 4. Therefore, the current flowing through the control head coil 5 in the direction from the end C to the end D is cut off to cause abrupt current change. In the instant when the control signal B is changed from a high level into a low level, therefore, back electromotive force is caused to continuously make the current flow in the direction from the end C to the end D, whereby the potential at the point D exceeds the source voltage $V_{CC}$. After a lapse of a constant period, no current flows through the control head coil 5, and the potentials at the points C and D substantially reach the source voltage $V_{CC}$. Operation similar to the above is thereafter performed in sequence.

In the conventional control head driver of a video tape recorder having the aforementioned structure, back electromotive force is caused in the control head coil 5 by abrupt current change in switching of the control signal B, whereby the potential at an end of the control head coil 5 instantaneously drops to GND or exceeds the source voltage $V_{CC}$. When this circuit is integrated, such instantaneous potential change at the end of the control head coil 5 exerts influence on another circuit part of the integrated circuit, to cause malfunction.

SUMMARY OF THE INVENTION

The present invention directed to a head driver for driving a coil head for recording a signal responsive to a current flowing through the coil head in a magnetic recording medium.

A head driver according to the present invention comprises first and second source terminals for supplying first and second potentials, respectively, a capacitor having first and second ends, the first end being connected to the first source terminal, a control terminal for receiving a control signal having first and second levels for switching charging and discharging of the capacitor, a charging and discharging circuit provided between the first and second source terminals, having an input connected to the control terminal and an output connected to the second end of the capacitor, for charging the capacitor in response to the first level of the control signal and discharging the capacitor in response to the second level of the control signal, a voltage-current conversion circuit connected to the second end of the capacitor for converting a charging voltage of the capacitor to output a first current responsive to a level of the charging voltage, and a first current supply circuit connected with the coil head and the voltage-current conversion circuit for supplying the first current output from the voltage-current conversion circuit to the coil head.

According to the present invention, a capacitor is charged and discharged on the basis of the level of a control signal to supply charging voltage of the capacitor to a coil head, whereby no abrupt change is caused in current flowing in the coil head in switching of the control signal. Thus, no back electromotive force is caused and no malfunction is caused in another circuit part when the inventive circuit is integrated.

Accordingly, an object of the present invention is to obtain a head driver which causes no abrupt current change in switching of a control signal.

These and other objects, features, aspects and advantages of the present invention will become more apparent from the following detailed description of the invention when taken in conjunction with the accompanying drawings.

DESCRIPTION OF THE PREFERRED EMBODIMENT

Figure 1:
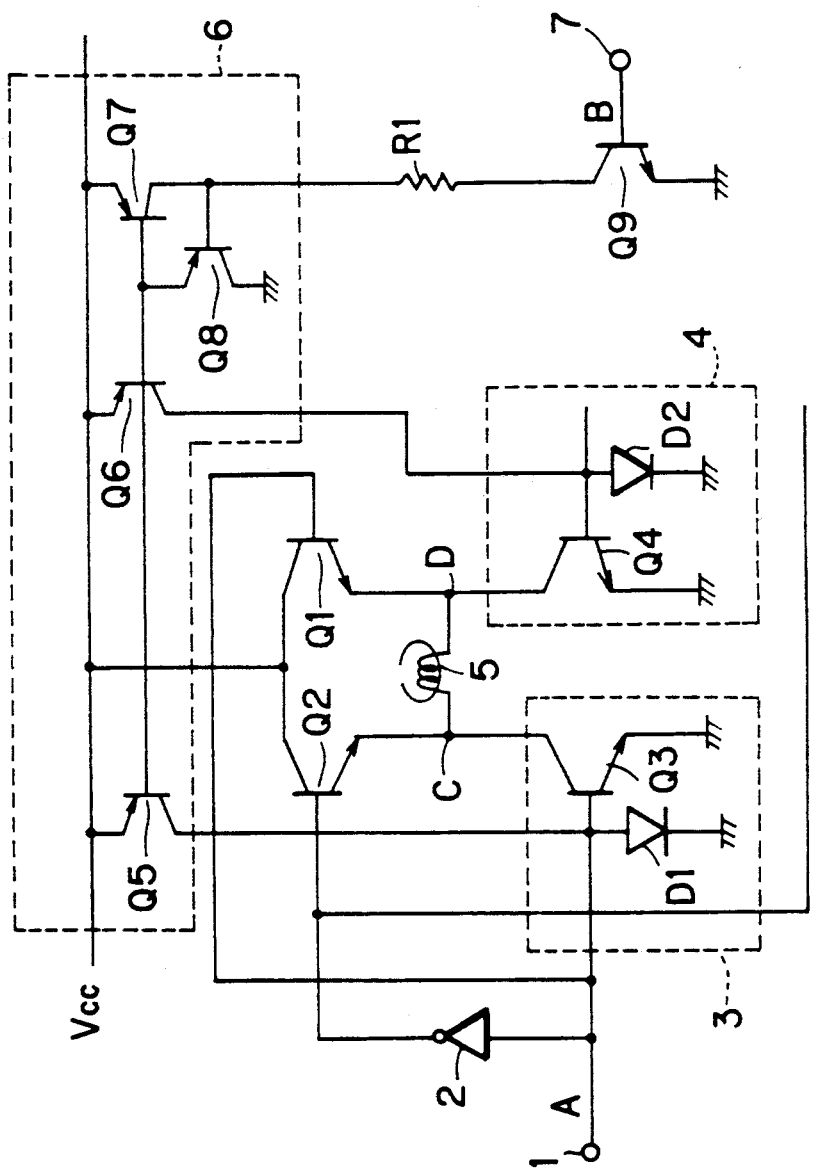
FIG. 1 is a circuit diagram showing a conventional control head driver of a video tape recorder.
Figure 3:
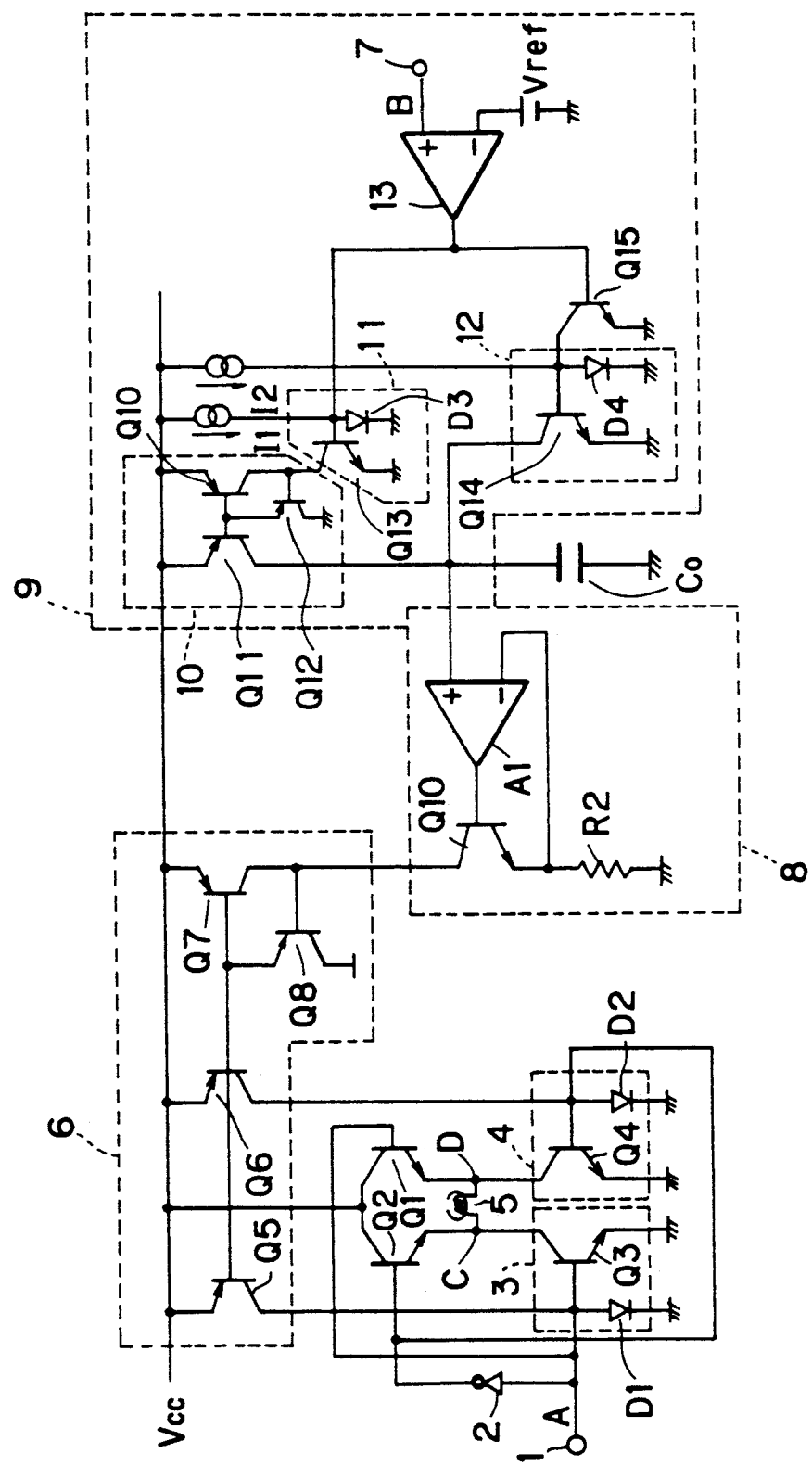
FIG. 3 is a circuit diagram showing an embodiment of a head driver according to the present invention.

FIG. 3 is a circuit diagram showing an embodiment of a head driver according to the present invention. Referring to FIG. 3, this circuit is different from the conventional circuit shown in FIG. 1 in that this circuit is provided with a capacitor $C_O$, a voltage-current converter (hereinafter referred to as a V-I converter) 8 for converting charging voltage of the capacitor $C_O$ into current and a charging and discharging circuit 9 for charging and discharging the capacitor $C_O$ in response to a control signal B. The V-I converter 8 is formed by an operational amplifier A1, an NPN transistor Q10 and a resistor R2. The transistor Q10 has a base which is connected to an output of the operational amplifier A1, a collector which is connected to a collector of a transistor Q7 and an emitter which is grounded through the resistor R2 and connected to a minus input of the operational amplifier A1. The capacitor $C_O$ is connected between a plus input of the operational amplifier A1 and the ground.

The charging and discharging circuit 9 includes a charging circuit which is formed by current mirrors 10 and 11, a discharging circuit which is formed by a current mirror 12, and a comparator 13. The current mirror 10 is formed by PNP transistors Q10, Q11 and Q12. The transistors Q10 and Q11 have commonly connected bases and emitters which are connected to source voltage $V_{CC}$. The transistor Q11 has a collector which is connected to the plus input of the operational amplifier A1. The transistor Q12 has an emitter which is connected to the base of the transistor Q10, a base which is connected to the collector of the transistor Q10 and a collector grounded.

The current mirror 11 is formed by an NPN transistor Q13 and a diode D3. The transistor Q13 has a collector which is connected to the collector of the transistor Q10, an emitter which is grounded and a base which is connected to an anode of the diode D3 as well as to the source voltage $V_{CC}$ through a current source I1. The diode D3 has a cathode grounded.

The current mirror 12 is formed by an NPN transistor Q14 and a diode D4. The transistor Q14 has a collector which is connected to the plus input of the operational amplifier A1, a base which is connected to an anode of the diode D4 and an emitter which is grounded. The base of the transistor Q14 is also connected to the source voltage $V_{CC}$ through a current source I2. The cathode of the diode D4 is grounded.

The comparator 13 has a plus input which is connected to a control signal input terminal 7 and a minus input which is connected with a reference voltage source $V_{ref}$. An output of the comparator 13 is connected to the base of the transistor Q13 as well as a base of an NPN transistor Q15. The transistor Q15 has a collector which is connected to the base of the transistor Q14 and an emitter grounded. The comparator 13 outputs a high level when a high level is inputted, while outputting a low level when a low level is inputted. Other structure is similar to that of the conventional circuit shown in FIG. 1.

Figure 4:
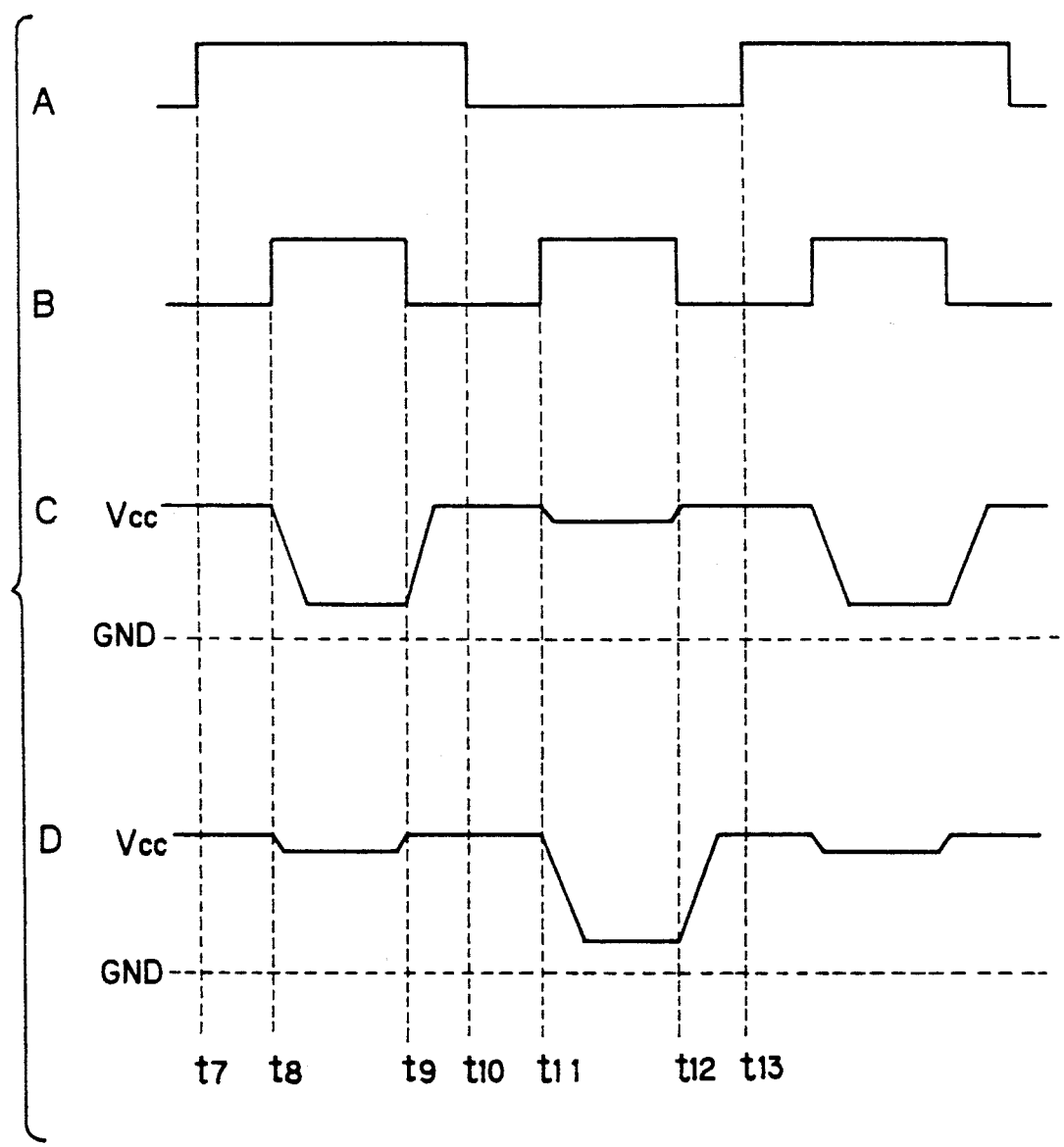
FIG. 4 is a diagram for illustrating operation of the circuit shown in FIG. 3.
Figure 2:
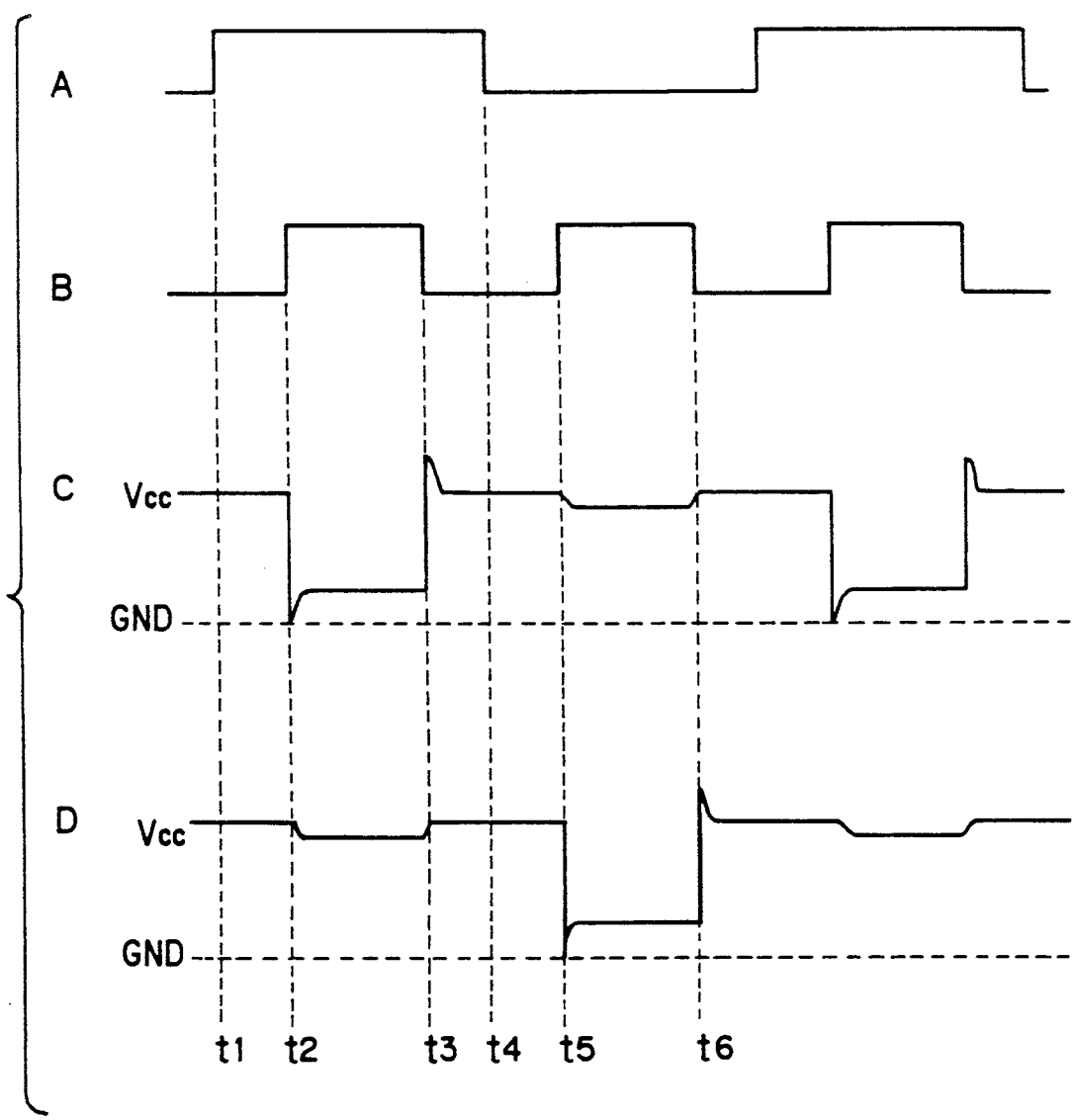
FIG. 2 is a diagram for illustrating operation of the circuit shown in FIG. 1.

FIG. 4 illustrates voltage waveforms at the respective terminals of the circuit shown in FIG. 3. Operation of the circuit shown in FIG. 3 will now be described with reference to FIG. 4.

It is assumed that an input signal A received in an input terminal 1 and the control signal B received in the control signal input terminal 7 are at low levels before a time t7. A transistor Q2 is in an ON state and a transistor Q1 is in an OFF state in this case, while a current mirror 4 is in a selected state and a current mirror 3 is disabled. Since the control signal B is at a low level, the comparator 13 outputs a low level. This low level is supplied to the base of the transistor Q15 and a common junction between the base of the transistor Q13 and the anode of the diode D3. In response to the low level, the transistor Q15 enters an OFF state, so that the potential at a common junction between the base of the transistor Q14 and the anode of the diode D4 goes high. Thus, the current mirror 12 is activated to discharge the capacitor $C_O$. At the time t7, the capacitor $C_O$ is completely discharged. On the other hand, since the current mirror 11 is disabled, the current mirror 10 is also disabled and hence the capacitor $C_O$ is not charged. Thus, a current mirror 6 is in a disabled state, so that no current flows through a control head coil 5.

It is assumed that only the input signal A goes high at the time t7. Then, the transistor Q2 is turned off and the transistor Q1 is turned on, while the current mirror 4 is disabled and the current mirror 3 enters a selected state. However, since the control signal B remains low level, no current flows through the control head coil 5 as hereinabove described, and the potentials at both ends C and D of the control head coil 5 substantially reach the source voltage $V_{CC}$ similarly to the conventional case.

It is assumed that the control signal B is changed from a low level to a high level at a time t8. Then, the comparator 13 outputs a high level, which is in turn supplied to the base of the transistor Q15 and the common junction between the base of the transistor Q13 and the anode of the diode D3. In response to the high level, the transistor Q15 is turned on, so that the base potential at the transistor Q14 goes low. Consequently, the current mirror 12 is disabled and discharging of the capacitor $C_O$ is stopped. The capacitor $C_O$ is in a completely discharged state, as hereinabove described. On the other hand, the current mirror 11 is activated through supply of the high level. Therefore, charging of the capacitor $C_O$ is started through the current mirror 10, whereby charging voltage of the capacitor $C_O$ is gradually increased. The charging voltage of the capacitor $C_O$ is supplied to the plus input of the operational amplifier A1. The operational amplifier A1 supplies voltage, which is proportional to the charging voltage of the capacitor $C_O$, to the transistor Q10. Current conductivity of the transistor Q10 is varied with the level of the voltage supplied from the operational amplifier A1. The current mirror 6 is supplied with current responsive to current conductivity of the transistor Q10. In other words, the current mirror 6 is supplied with current responsive to the charging voltage of the capacitor $C_O$. The current mirror 3, which is in a selected state, is supplied with current from the current mirror 6. Thus, current flows through the control head coil 5 in a direction from the end D to the end C. Since the current responsive to the charging voltage of the capacitor $C_O$ flows in the current mirror 6 as hereinabove described, gradually increasing current flows in the direction from the end D to the end C of the control head coil 5. In other words, no abrupt current change is caused when the control signal B is changed from a low level into a high level. Thus, no back electromotive force is caused and the potential at the point C is not pulled down to GND dissimilarly to the conventional case, but is gradually reduced. The potential at the point C is stabilized at a level which is smaller than the source voltage $V_{CC}$ by voltage drops at the transistor Q1 and the control head coil 5, similar to the conventional case. The potential at the point D is stabilized at a level which is smaller than the source voltage $V_{CC}$ by a voltage drop caused by the transistor Q1, also similar to the conventional case.

It is assumed that only the control signal B is changed from a high level into a low level at a time t9. Then, the comparator 13 outputs a low level. In response to this low level, the current mirrors 10 and 11 are disabled, so that charging of the capacitor $C_O$ is stopped. Through supply of the low level, on the other hand, the transistor Q15 is turned off, so that the potential at the anode of the diode D4 goes high to acivate the current mirror 12. Consequently, the capacitor $C_O$ is discharged through the current mirror 12, and hence the charging voltage of the capacitor $C_O$ is gradually reduced. With such reduction, output voltage of the operational amplifier A1 as well as current conductivity of the transistor Q10 are reduced. Thus, the current supplied to the current mirror 3 through the current mirror 6 is gradually reduced, and hence the current flowing in the direction from the end D to the end C of the control head coil 5 is also gradually reduced. In other words, no abrupt current change is caused when the control signal B is changed from a high level into a low level. Thus, no back electromotive force is caused and the potential at the point C will not instantaneously exceed the source voltage $V_{CC}$ dissimilarly to the conventional case but is gradually increased. When no current flows in the current mirror 3, i.e., when the capacitor $C_O$ is completely discharged, no current flows through the control head coil 5, so that the potentials at the points C and D substantially reach the source voltage $V_{CC}$.

It is assumed that the input signal A is changed from a high level into a low level at a time t10. In this case, it is similar to the conventional case that the transistor Q2 is turned on and the transistor Q1 is turned off, while the current mirror 3 is disabled and the current mirror 4 enters a selected state. However, since the control signal B remains low level so that the capacitor $C_O$ is in a completely discharged state as hereinabove described, no current flows through the control head coil 5 and hence the potentials at the ends C and D of the control head coil 5 substantially reach the source voltage $V_{CC}$ similar to the conventional case.

It is assumed that only the control signal B is changed from a low level into a high level at a time t11. Then, the comparator 13 outputs a high level as hereinabove described so that the current mirrors 10 and 11 are activated to start charging of the capacitor $C_O$. Thus, current responsive to the charging voltage of the capacitor $C_O$ is supplied to the current mirrors 3 and 4 through the current mirror 6. Since the current mirror 4 is currently in a selected state, the current in the direction from the end C to the end D of the control head coil 5 is gradually increased. Thus, when the input signal A is at a low level, no abrupt current change is caused even if the control singal B is changed from a low level into a high level. Therefore, no back electromotive force is caused, and hence the potential at the point D is not pulled down to GND dissimilarly to the conventional case but is gradually reduced. The potential at the point D is stabilized at a level which is smaller than the source voltage $V_{CC}$ by voltage drops at the transistor Q1 and the control head coil 5, similar to the conventional case. The potential at the point C is stabilized at a level which is smaller than the source voltage $V_{CC}$ by a voltage drop caused by the transistor Q2, also similar to the conventional case.

It is assumed that the control signal B is changed from a high level into a low level at a time t12. Then, the comparator 13 outputs a low level as hereinabone described to disable the current mirrors 10 and 11 and activate the current mirror 12. Thus, discharging of the capacitor $C_O$ is started, so that current responsive to the charging voltage of the capacitor $C_O$ is supplied to the current mirrors 3 and 4. Since the current mirror 4 is currently in a selected state, the current in the direction from the end C to the end D of the control head coil 5 is gradually reduced. Thus, also when the input signal A is at a low level, no abrupt current change is caused even if the control signal B is changed from a high level into a low level. Therefore, no back electromotive force is caused, so that the potential at the point D does not exceed the source voltage $V_{CC}$ dissimilarly to the conventional case, but is gradually increased. The potential at the point D is substantially equal to the source voltage $V_{CC}$ similar to the conventional case when the capacitor $C_O$ is completely discharged. Operation similar to the above is repeated after a time t13.

As hereinabove described, no abrupt change is caused in the current flowing through the control head coil 5 when the control signal B is changed. Consequently, it never takes place that the potential at the point C or D of the control head coil 5 disadvantageously instantaneously reaches GND or exceeds the source voltage $V_{CC}$ as in the conventional case. Thus, when the invention circuit is integrated together with other circuit parts, no influence is exerted to the other circuit parts, so that no malfunction is caused in the other circuit parts.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A head driver for driving a coil head for recording a signal responsive to a current flowing through the coil head in a magnetic recording medium, comprising:
   first and second source terminals for supplying first and second potentials, respectively;
   a capacitor having first and second ends, said first end being connected to said first source terminal;
   a control terminal for receiving a control signal having first and second levels for switching charging and discharging of said capacitor;
   a charging and discharging circuit provided between said first and second source terminals, having an input connected to said control terminal and an output connected to said second end of said capacitor, for charging said capacitor in response to said first level of said control signal and discharging said capacitor in response to said second level of said control signal;
   a voltage-current conversion circuit connected to said second end of said capacitor for converting a charging voltage of said capacitor to output a first current responsive to a level of the charging voltage; and
   a first current supply circuit connected with said coil head and said voltage-current conversion circuit for supplying said first current output from said voltage-current conversion circuit to said coil head.

2. A head driver in accordance with claim 1, wherein said charging and discharging circuit includes input means connected to said control terminal,
   said input means comprising
   a reference voltage source for supplying a reference voltage of a level between said first and second levels of said control signals, and
   a comparator having first and second inputs connected to said control terminal and said reference voltage source, respectively, and an output, for outputting first and second signals in response to said first and second levels of said control signal, respectively.

3. A head driver in accordance with claim 2, wherein said charging and discharging circuit further includes
   a charging circuit provided between said second source terminal and said second end of said capacitor and connected to said output of said comparator, for charging said capacitor in response to said first signal, and
   a discharging circuit provided between said first source terminal and said second end of said capacitor and connected to said output of said comparator, for discharging said capacitor in response to said second signal.

4. A head driver in accordance with claim 1, wherein said voltage-current conversion circuit comprises
an aperational amplifier having first and second inputs and an output, said first input being connected to said second end of said capacitor,
a first transistor having a first electrode through which said first current is output, a second electrode connected to said second input of said operational amplifier and a control electrode connected to said output of said operational amplifier, and
a resistor connected between said second electrode of said first transistor and said first source terminal.

5. A head driver in accordance with claim 4, wherein
said first current supply circuit comprises
a first current mirror circuit connected to said first electrode of said first transistor, for supplying a second current responsive to said first current output through said first electrode of said first transistor,
an input terminal for receiving an input signal for changing a direction of said current flowing through said coil head, and
a second current supply circuit connected to said first current mirror circuit and said input terminal, for supplying a third current responsive to said second current to said coil head in a direction responsive to said input signal.

6. A head driver in accordance with claim 3, wherein
said charging circuit includes a second current mirror circuit provided between said second source terminal and said second end of said capacitor, and coupled to said output of said comparator, for charging said capacitor in response to said first signal.

7. A head driver in accordance with claim 6, wherein
said charging circuit further includes a third current mirror circuit provided between said first and second source terminals and connected to said output of said comparator and said second current mirror circuit, which is activated in response to said output of said comparator to activate said second current mirror circuit.

8. A head driver in accordance with claim 3, wherein
said discharging circuit includes a fourth current mirror circuit provided between said first source terminal and said second end of said capacitor, for discharging said capacitor in response to said second signal.

9. A head driver in accordance with claim 8, wherein
said discharging circuit further includes a second transistor having first, second and control electrodes connected to said fourth current mirror circuit, said first source terminal and said output of said comparator, respectively, for activating said fourth current mirror circuit in response to said second signal.

10. A head driver in accordance with claim 5, wherein
said coil head has first and second ends,
said input singal has first and second levels, and
said second current supply circuit comprises
a third transistor having first and second electrodes connected to said second source terminal and said first end of said coil head, respectively, and a control electrode coupled to said input terminal, which is turned on in response to said first level of said input signal,
a fourth transistor having first and second electrodes connected to said second source terminal and said second end of said coil head, respectively, and a control electrode coupled to said input terminal, which is turned on in response to said second level of said input signal,
a fifth current mirror circuit provided between said first end of said coil head and said first source terminal and coupled to said first current mirror circuit and said input terminal, which is activated in response to said second level of said input signal to supply said third current in a direction from said second end to said first end of said coil head,
a sixth current mirror circuit provided between said second end of said coil head and said first source terminal and coupled to said first current mirror circuit and said input terminal, which is activated in response to said first level of said input signal to supply said third current in a direction from said first end to said second end of said coil head.

11. A head driver in accordance with claim 10, wherein
said second current supply circuit further comprises an inverter having an input connected to said input terminal and an output connected to said control electrode of said third transistor and said sixth current mirror circuit.

12. A head driver in accordance with claim 10, wherein
said first current mirror circuit comprises
a fifth transistor having first and second electrodes connected to said fifth current mirror circuit and said second source terminal, respectively, and a control electrode,
a sixth transistor having first and second electrodes connected to said sixth current mirror circuit and said second source terminal, respectively, and a control electrode connected to said control electrode of said fifth transistor,
a seventh transistor having first and second electrodes connected to said first electrode of said first transistor and said second source terminal, respectively, and a control electrode connected to said control electrode of said fifth transistor, and
an eighth transistor having first and second electrodes connected to said first source terminal and said control electrode of said seventh transistor, respectively, and a control electrode connected to said first electrode of said seventh transistor.

13. A head driver in accordance with claim 12, wherein
said fifth current mirror circuit comprises
a ninth transistor having first and second electrodes connected to said first end of said coil head and said first source terminal, respectively, and a control electrode coupled to said input terminal, and
a first diode connected across said control electrode of said ninth transistor and said first source terminal,
said sixth current mirror circuit comprising
a tenth transistor having first and second electrodes connected to said second end of said coil head and said first source terminal, respectively, and a control electrode coupled to said input terminal, and
a second diode connected across said control electrode of said tenth transistor and said first source terminal.

14. A head driver in accordance with claim 7, wherein
said second current mirror circuit comprises a eleventh transistor having a first electrode, a second electrode connected to said second source terminal and a control electrode, a twelfth transistor having first and second electrodes connected to said second end of said capacitor and said second source terminal, respectively, and a control electrode connected to said control electrode of said eleventh transistor, and a thirteenth transistor having first, second and control electrodes connected to said first source terminal, said control electrode of said eleventh transistor and said first electrode of said eleventh transistor, said third current mirror circuit comprising a fourteenth transistor having first and second electrodes connected to said first electrode of said eleventh transistor and said first source terminal, respectively, and a control electrode coupled to said second source terminal and said output of said comparator, and a third diode connected across said control electrode of said fourteenth transistor and said first source terminal.

15. A head driver in accordance with claim 9, wherein said fourth current mirror circuit comprises a fifteenth transistor having first and second electrodes connected to said second end of said capacitor and said first source terminal, respectively, and a control electrode coupled to said second source terminal and said first electrode of said second transistor, and a fourth diode connected across said control electrode of said fifteenth transistor and said first source terminal.

* * * * *